United States Patent
Ota (10) Patent No.: US 7,495,851 B2
(45) Date of Patent: Feb. 24, 2009

(54) MOVING APPARATUS

(75) Inventor: Shunsuke Ota, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/044,825

(22) Filed: Mar. 7, 2008

(65) Prior Publication Data

US 2008/0225364 A1 Sep. 18, 2008

(30) Foreign Application Priority Data

Mar. 15, 2007 (JP) ............................ 2007-066879
Feb. 5, 2008 (JP) ............................ 2008-025236

(51) Int. Cl.
*G02B 7/02* (2006.01)
*G02B 15/14* (2006.01)

(52) U.S. Cl. .................. 359/819; 359/694; 359/700

(58) Field of Classification Search ......... 359/694–703, 359/819–823

See application file for complete search history.

(56) References Cited

U.S. PATENT DOCUMENTS 5,241,422 A * 8/1993 Shimada et al. ............. 359/694
7,016,123 B2 * 3/2006 Yano .......................... 359/697

FOREIGN PATENT DOCUMENTS

JP 2000-021744 A 1/2000

* cited by examiner

*Primary Examiner*—Mohammed Hasan
(74) *Attorney, Agent, or Firm*—Canon U.S. A., Inc. I.P. Division (57) ABSTRACT

A moving apparatus includes a cylindrical cam barrel provided with a cam groove; a moving member configured to be rotated relative to the cam barrel and moved in a perpendicular direction that is an axis direction of the cam barrel; and a bearing for supporting a support shaft fixed on the moving member in the cam groove, wherein when viewed from the axis direction of the support shaft, a contact position F between the bearing and the cam groove is located closer to the side of the rotation center axis of the moving member than the axis line of the support shaft.

2 Claims, 8 Drawing Sheets

MOVING APPARATUS

BACKGROUND OF THE INVENTION

1. Field of the Invention

The present invention relates to a moving apparatus utilizing a cam groove.

2. Description of the Related Art

A semiconductor exposure apparatus transfers a pattern of a reticle using a laser beam. Currently, the semiconductor exposure apparatus transfers a pattern having a line width of the order of nanometers. This type of semiconductor exposure apparatus includes an illumination optical system (optical apparatus) to irradiate reticle with light guided from a light source. This illumination optical system includes a plurality of optical components which are used to set a desired illumination condition such as an illuminating region, illuminance, the distribution of illuminance, the shape of an effective light source of a light beam irradiated to a reticle. In the illumination optical system, in order to change the size of, for example, the effective light source, a moving apparatus for moving an optical component is used. As one of such moving apparatuses, a cylindrical cam barrel having a cam groove is used.

Figure 7:
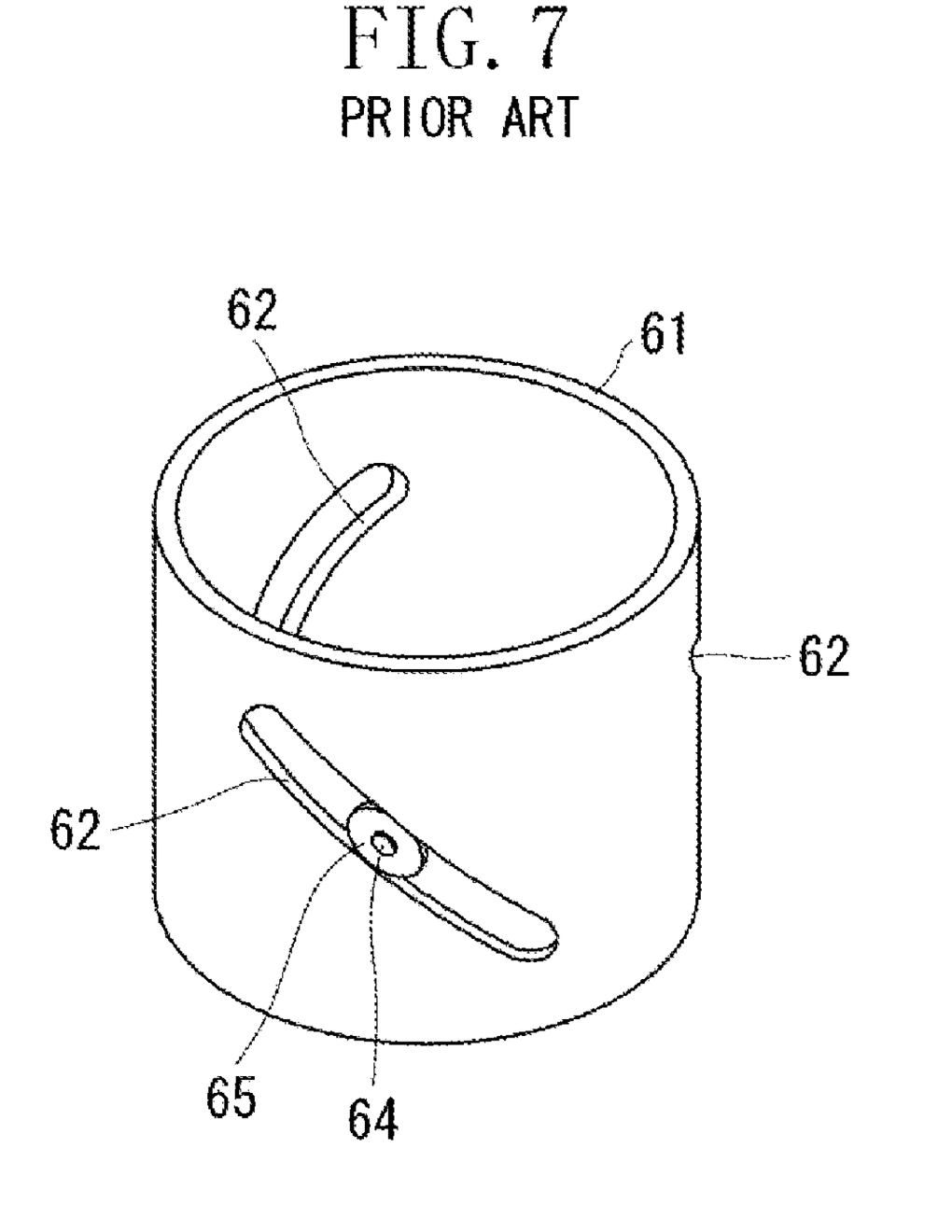
FIG. 7 is a perspective view illustrating a conventional moving apparatus.
Figure 8:
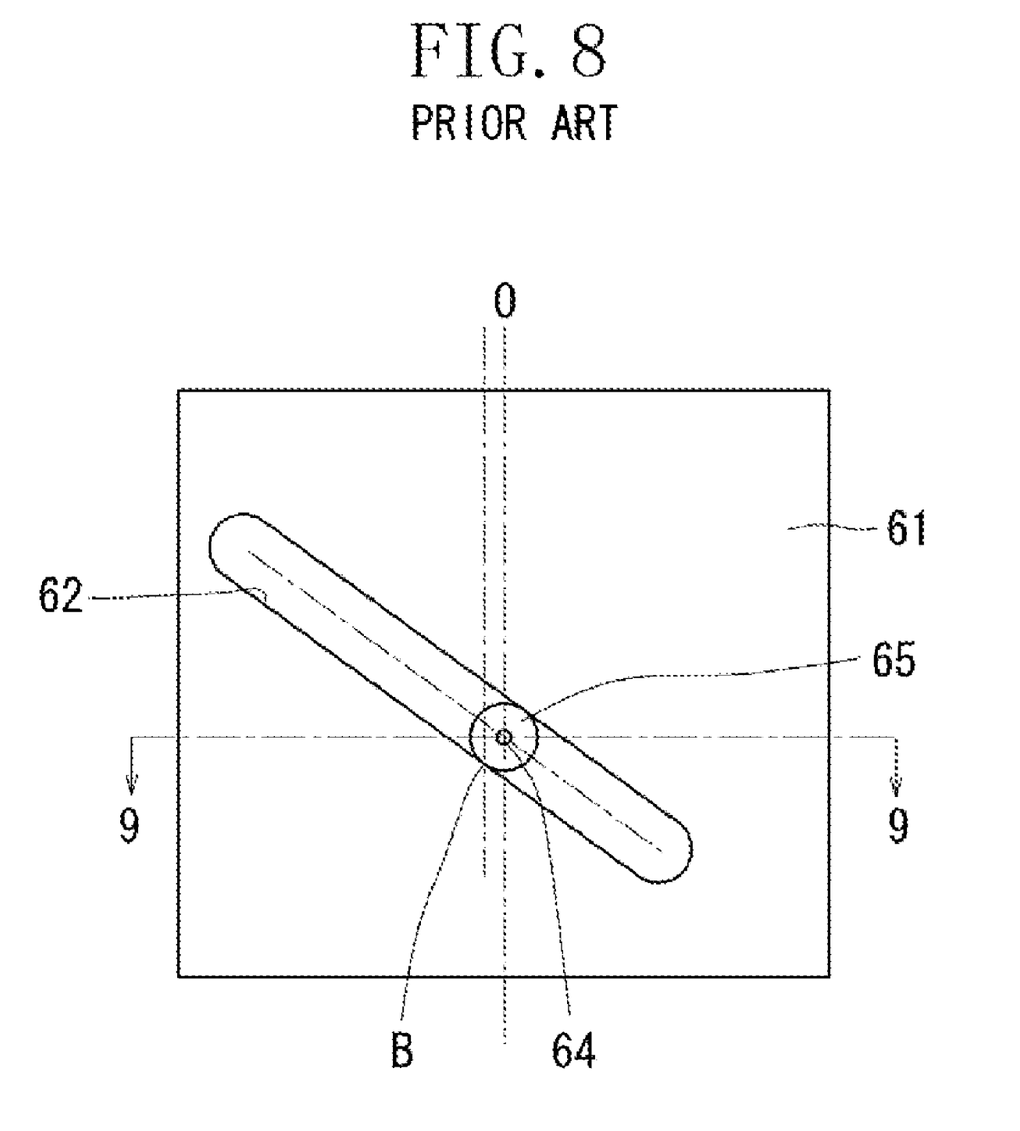
FIG. 8 illustrates a side view in FIG. 7.
Figure 9:
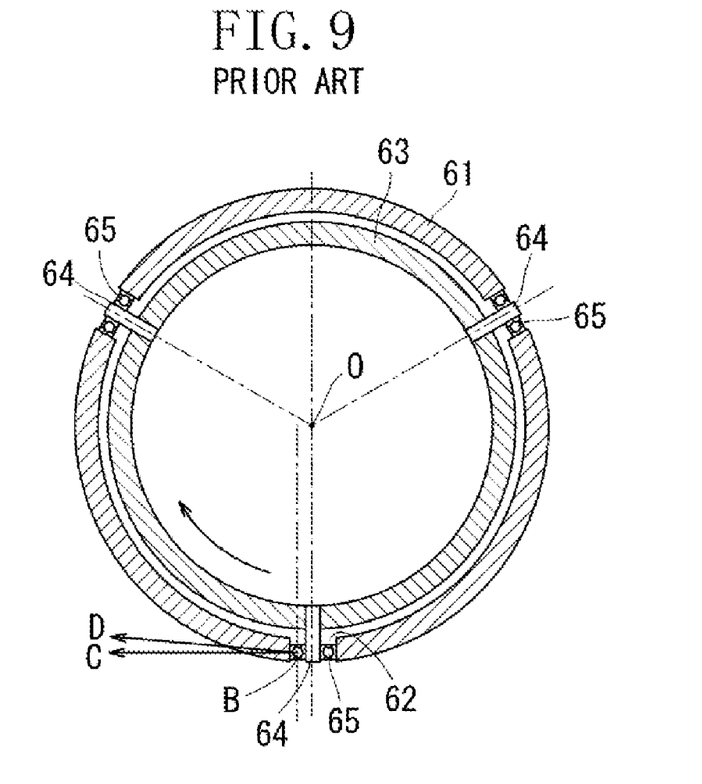
FIG. 9 illustrates a cross sectional view taken along line 9-9 in FIG. 8.

FIG. 7 is a perspective view illustrating a cam barrel 61 that includes a conventional cam groove and FIG. 8 is its side view. FIG. 9 is a cross sectional view taken along line 9-9 in FIG. 8. Three cam grooves 62 are formed on the cam barrel 61. These cam grooves 62 are formed in a perpendicular direction, that is, these cam grooves 62 are obliquely formed against a vertical direction in FIG. 8. Inside the cam barrel 61, a moving member 63 is disposed. Three support shafts 64 are fixed on the moving member 63. A bearing 65 such as a rolling bearing is fixed on the support shaft 64. The moving member 63 is supported by the cam barrel 61 via the bearing 65. While the cam barrel 61 and the moving member 63 are relatively rotated, the moving member 63 is moved in a perpendicular direction.

In a conventional cam barrel 61 as described in FIGS. 7 to 9, the support shaft 64 is disposed so that the extended line of the support shaft 64 passes through the rotation center axis O of the cam barrel 61.

However, in such a disposition, in a contact point B where the bearing 65 and the cam barrel 61 come into contact, the bearing 65 and the cam barrel 61 move in a different direction. This accelerates abrasion of the bearing 65 and the cam barrel 61.

Figure 10:
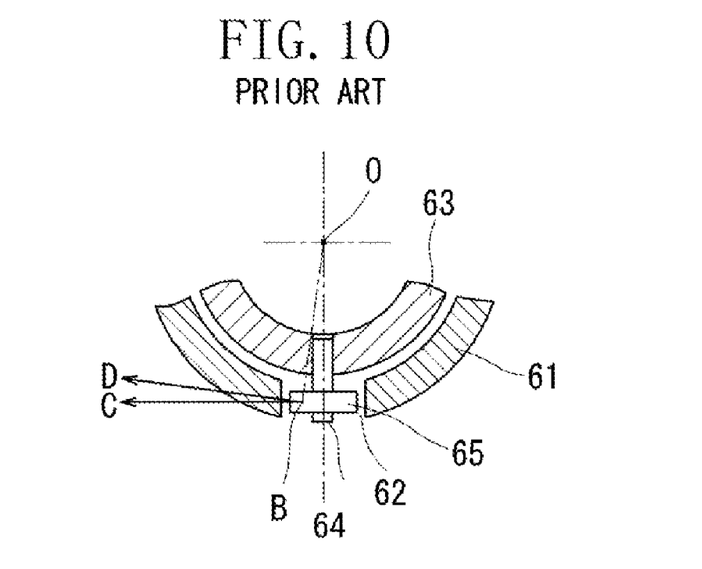
FIG. 10 is an enlarged cross sectional view illustrating a contact portion in FIG. 9.

FIG. 10 is an enlarged sectional view illustrating a contact portion. The bearing 65 is brought into contact with the cam barrel 61 at the contact point B in the lower surface of the cam groove 62 by the force (gravity) applied to the moving member 63. When the moving member 63 and the cam barrel 61 are relatively rotated, at the contact point B, the cam barrel 61 is moved in a tangential direction D of a circle center on the rotation center axis O. In contrast, the bearing 65 is fixed on the support shaft 64. At the contact point B, the bearing 65 is moved in a direction C perpendicular to the support shaft 64.

If the moving member 63 is moved in the state where a large difference exists in moving directions of the cam barrel 61 and the bearing 65 as described above, the bearing 65 is dragged in the cam groove 62. Thus, abrasion of the bearing 65 and the cam barrel 61 is accelerated. As a result, durability of an apparatus is reduced and an abraded powder is increasingly generated, both of which are not preferable. In particular, weight of an optical component of an exposure apparatus that forms the pattern of a reticle on a wafer tends to increase along with increase in numerical aperture. If the weight of the optical component is increased, the diameter of a bearing which supports the component must be increased to maintain durability. However, if the diameter of the bearing is large, a difference in a moving direction as described above is increased.

SUMMARY OF THE INVENTION

The present invention is directed to a moving apparatus which can reduce abrasion of a cam barrel and a bearing.

According to an aspect of the present invention, a moving apparatus includes a cylindrical cam barrel having a cam groove; a moving member configured to be rotated relative to the cam barrel and moved in a perpendicular direction that is an axis direction of the cam barrel; and a bearing for supporting a support shaft fixed on the moving member with the cam groove, wherein when viewed from the axis direction of the support shaft, a contact position between the bearing and the cam groove is located closer to the side of the rotation center axis of the moving member than the axis line of the support shaft under force exerted in a axis direction of the cam barrel against the moving member.

According to an aspect of the present invention, a moving apparatus can reduce abrasion of a cam barrel and a bearing.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the drawings.

First Exemplary Embodiment

Figure 1:
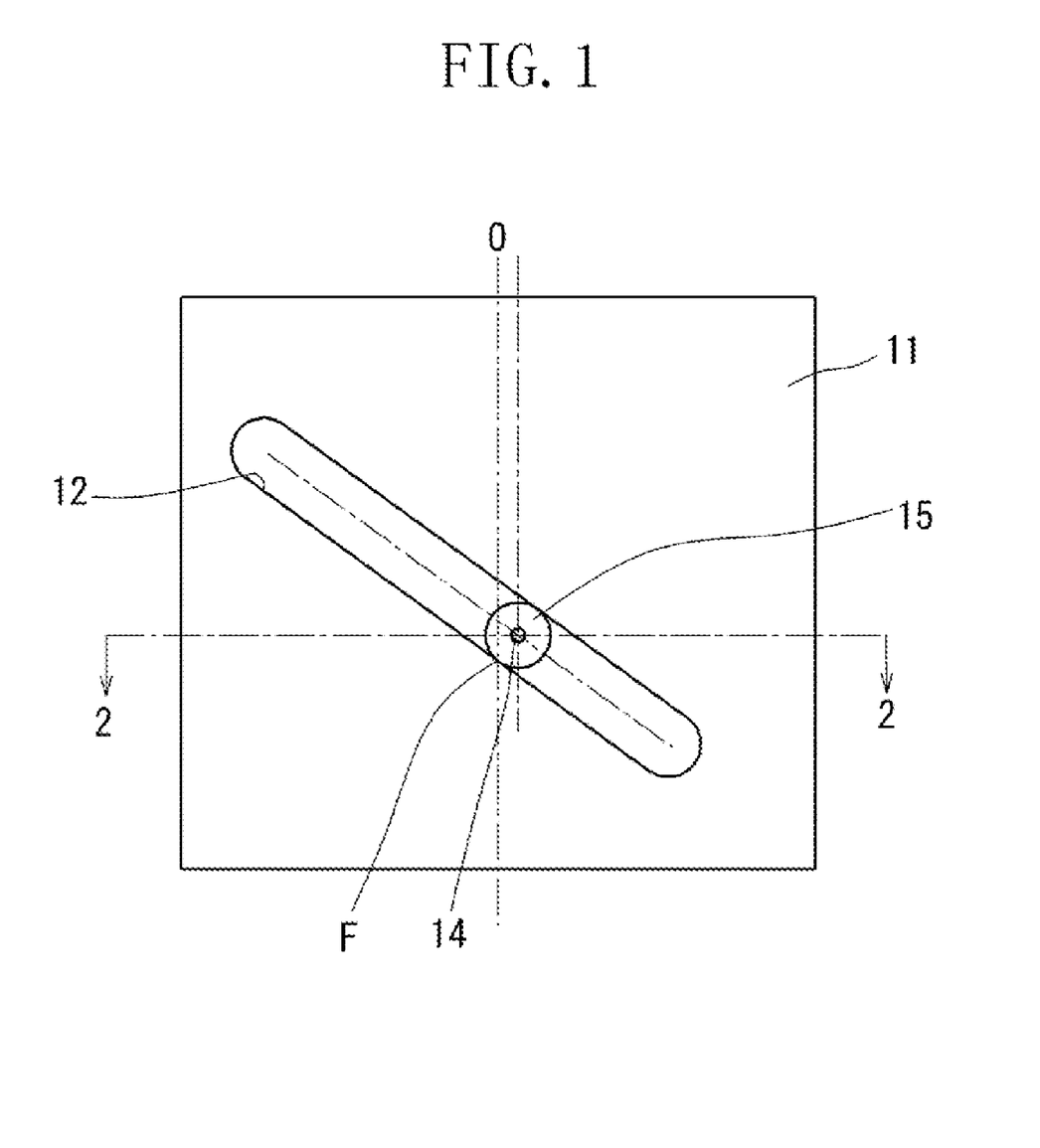
FIG. 1 is a side view illustrating a moving apparatus according to a first exemplary embodiment of the present invention.
Figure 2:
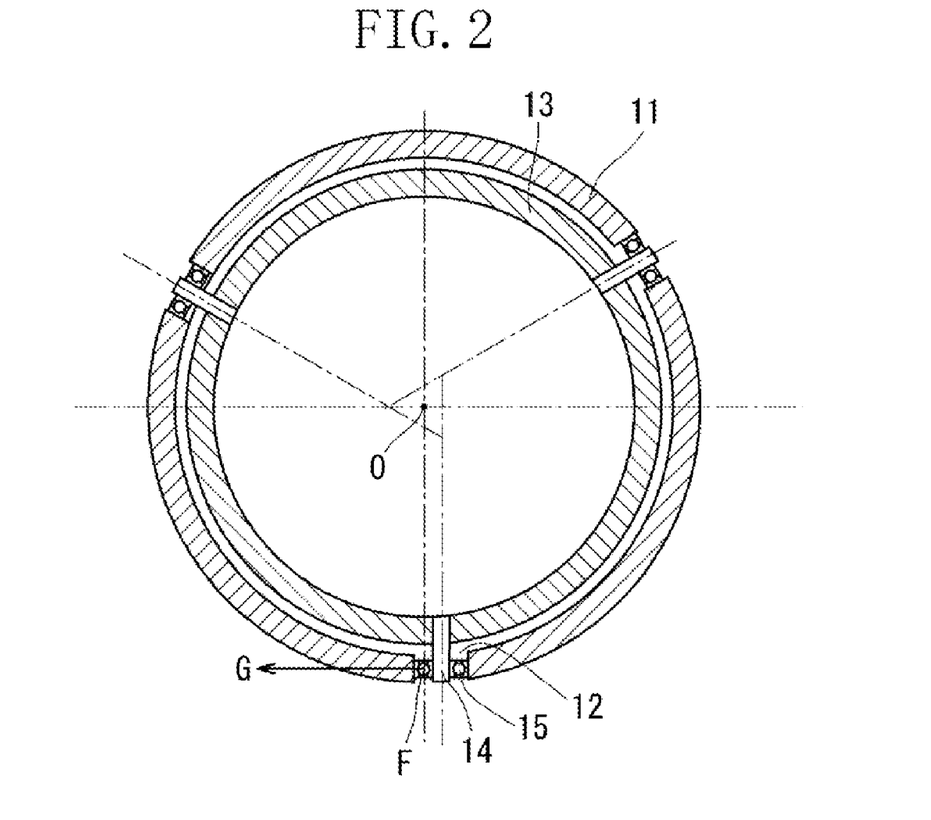
FIG. 2 illustrates a cross sectional view taken along line 2-2 in FIG. 1.

FIG. 1 is a side view illustrating a moving apparatus according to a first exemplary embodiment of the present invention. FIG. 2 illustrates a cross sectional view taken along line 2-2 in FIG. 1. A linear cam groove 12 is obliquely formed on a cylindrical cam barrel 11 relative to a vertically perpendicular direction in FIG. 1. Inside the cam barrel 11, a moving member 13 having a rotation center axis O is concentrically disposed. Three support shafts 14, which serve as follower portions, are mounted on the moving member 13 toward the cam barrel 11 in a position corresponding to the cam grooves 12. In the present exemplary embodiment, three cam grooves 12 and three support shafts 14 are respectively provided as an example. However, other than three cam grooves 12 and support shafts 14 may be employed. A bearing 15 is fixed on the support shaft 14. The moving member 13 is supported by the cam barrel 11 via the bearing 15.

In such a configuration, while the cam barrel 11 and the moving member 13 are relatively rotated, the cam barrel 11 and the moving member 13 are moved in a perpendicular direction. In the present exemplary embodiment, the moving member 13 is a cylindrical member concentrically disposed inside the cam barrel 11. However, the moving member 13 is not limited to this configuration. As for the bearing 15, for example, a rolling bearing is used. By gravity applied to the moving member 13, the bearing 15 is brought into contact with the cam barrel 11 at a contact point F on the lower surface of the cam groove 12.

As can be understood by comparing FIG. 1 in the present exemplary embodiment and FIG. 7 in a conventional example, according to the present exemplary embodiment, the extended line of the axis of the support shaft 14 is shifted by a predetermined offset amount from the rotation center axis O in a horizontal direction. Further, when viewed from the axis direction of the support shaft 14, the contact point F where the bearing 15 and the cam barrel 11 contact is located closer to the rotation center axis O side than the axis line of the support shaft 14 in a horizontal direction. That is, in order to produce such relation of position, the support shaft 14 is disposed on the moving member 13 or the cam groove 12 is formed on the cam barrel 11. Consequently, a difference between the moving direction of the cam barrel 11 in the contact point and the rotation moving direction of the bearing 15 can be reduced. A decrease in difference between these moving directions can reduce abrasion of the bearing 15 and the cam barrel 11. Accordingly, durability of the moving member 13 can be enhanced and an abraded powder generated by abrasion can be reduced.

As can be understood from FIG. 2, in a horizontal plane passing through the contact point F, a straight line connecting the contact point F with the rotation center axis O is substantially parallel to the axis direction of the support shaft 14. Thus, the above-described offset amount is given by a distance between the contact point F and the axis line of the support shaft 14 in a horizontal direction. As a result, the moving direction G of the cam barrel 11 at the contact point F and the moving direction of the bearing 15 can be substantially conformed, thereby significantly reducing abrasion of the bearing 15 and the cam barrel 11.

Figure 3:
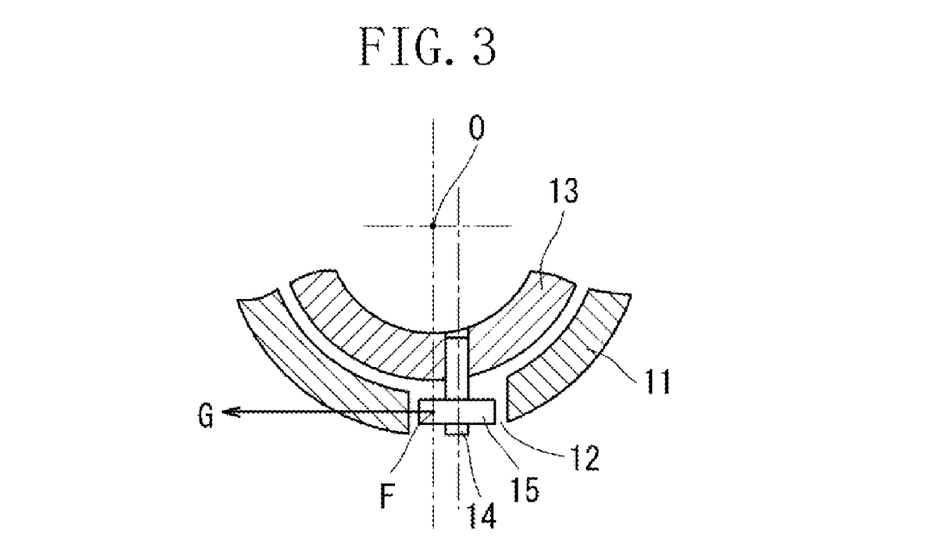
FIG. 3 is an enlarged cross sectional view illustrating a contact portion.

FIG. 3 is an enlarged sectional view illustrating the above-described relation. The moving direction G of the cam barrel 11 at the contact point F is a tangential direction at the contact point F of a circle center on the rotation center axis O. That is, the moving direction G is perpendicular to a straight line connecting the rotation center axis O with the contact point F. Further, the rotational moving direction of the bearing 15 at the contact point F is perpendicular to the axis line of the support shaft 14. In this way, the axis line of the support shaft 14 becomes parallel to the straight line connecting the contact point F with the rotation center axis O, so that the moving direction of the bearing 15 substantially conforms to the moving direction G. Note that it is desirable that the rotation center axis O of the moving member 13 conforms to the rotation center axis of the cam barrel 11.

Second Exemplary Embodiment

Figure 4:
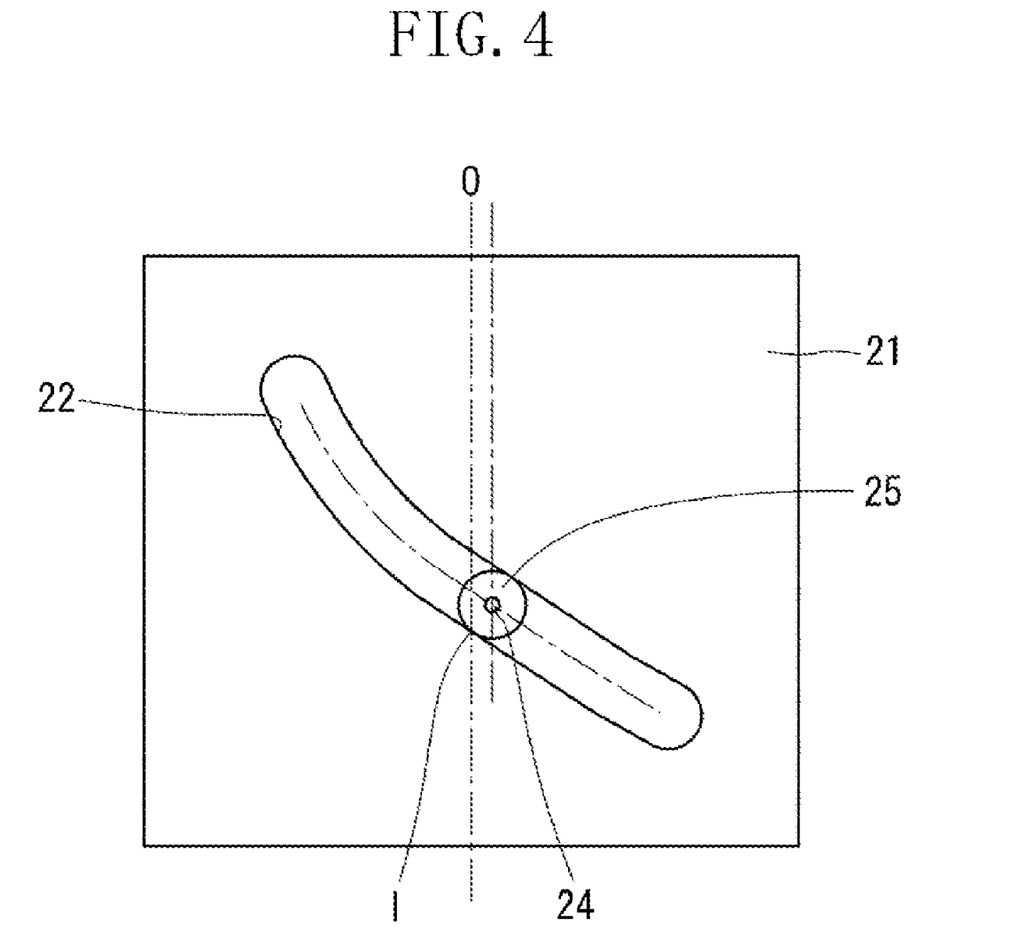
FIG. 4 is a side view illustrating a moving apparatus according to a second exemplary embodiment of the present invention.

FIG. 4 is a side view illustrating a moving apparatus according to a second exemplary embodiment of the present invention. In the first exemplary embodiment, the linear cam groove 12 is formed on the cam barrel 11. In contrast, in the second exemplary embodiment, a curved cam groove 22 is formed on a cam barrel 21.

In the second exemplary embodiment, by gravity applied to a moving member (not shown), a bearing 25 is brought into contact with the cam barrel 21 at a contact point I on the lower surface of the cam groove 22.

According to the present exemplary embodiment, the axis line of a support shaft 24 mounted on the moving member is shifted by a predetermined offset amount from the rotation center axis O in a horizontal direction. Further, when viewed from the axis direction of the support shaft 24, the contact point I of the bearing 25 and the cam barrel 21 is located closer to the rotation center axis O side than the position of the support shaft 24 in a horizontal direction. That is, in order to produce such relation of position, the support shaft 24 is disposed on the moving member or the cam groove 22 is formed on the cam barrel 21.

Consequently, a difference between the moving direction of the cam barrel 21 at the contact point I and the rotation moving direction of the bearing 25 can be reduced, thereby reducing abrasion of the bearing 25 and the cam barrel 21. As a result, durability of the moving member can be enhanced and an abraded powder generated by abrasion can be reduced.

Further, in the second exemplary embodiment, since the cam groove 22 is curved, the relation of position between the contact point I of the bearing 25 and the cam barrel 21, and the support shaft 24 changes as the bearing 25 and the support shaft 24 move along the cam groove 22.

Accordingly, in the present exemplary embodiment, in a horizontal plane passing through the contact point I, a straight line connecting the contact point I with the rotation center axis O is disposed parallel to the axis line of the support shaft 24 on average. Thus, the above-described offset amount is given by the average value of a distance between the axis line of the support shaft 24 and the contact point I when the support shaft axis 24 and the bearing 25 are moved in a predetermined moving range along the cam groove 22.

In this way, the cam groove 22 is formed or the support axis 24 is disposed such that an influence of a difference between the moving direction of the cam barrel 21 at the contact point I and the moving direction of the bearing 25 can be reduced in a moving range of the support shaft 24 and the bearing 25.

In another example of the second exemplary embodiment, when the support shaft 24 and the bearing 25 are located in a predetermined position, in a horizontal plane passing through the contact point I, a straight line connecting the contact point I with the rotation center axis O becomes parallel on average to the axis line of the support shaft 24. Thus, the above-described offset amount is given by a distance between the contact point I where the support shaft 24 and the bearing 25 are located in this predetermined position, and the axis line of the support shaft 24. The predetermined position can be given by, for example, a position where a distance between the contact point I and the axis line of the support shaft 24 becomes maximum when the support shaft 24 and the bearing 25 are moved within a moving range.

Third Exemplary Embodiment

Figure 5:
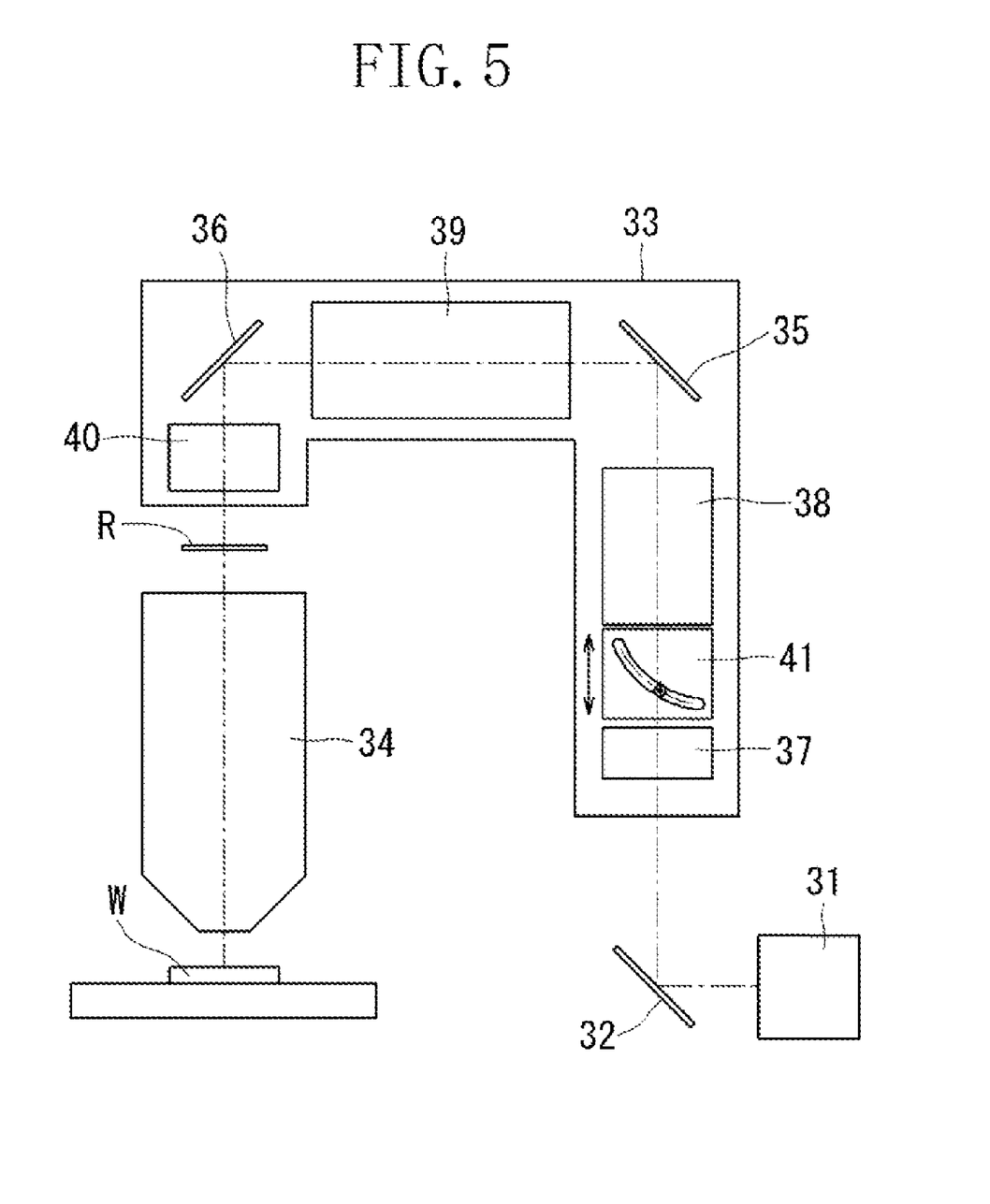
FIG. 5 is a diagram illustrating the optical system of an exposure apparatus according to a third exemplary embodiment of the present invention.

FIG. 5 is a diagram illustrating the optical system of an exposure apparatus according to a third exemplary embodiment of the present invention. The exposure apparatus includes a light source 31, a mirror 32, an illumination optical system 33, a reticle stage (not shown) which mounts a reticle R and moves, a projection optical system 34, and a wafer stage (not shown) which mounts a wafer W and moves.

A light beam irradiated from the light source 31 is reflected off the mirror 32, is incident to the illumination optical system 33, and is irradiated to the reticle R on the reticle stage via the illumination optical system 33. Then, light passing through the reticle R is irradiated to the wafer W on the wafer stage via the projection optical system 34. Thus, a pattern formed on the reticle R is transferred to the wafer W.

The illumination optical system 33 includes a plurality of optical components. The illumination optical system 33 is used to set a desired illumination condition such as an illuminating region, illuminance, the distribution of illuminance, and the shape of an effective light source of a light beam irradiated to the reticle R.

In FIG. 5, the optical component includes, for example, a lens disposed on mirrors 35 and 36, and mirror barrels 37, 38, 39 and 40. Further, the illumination optical system 33 includes the moving apparatus 41, which moves the optical component in order to change, for example, a size of an effective light source.

In this exposure apparatus, the moving apparatus described in the first and second exemplary embodiment as the moving apparatus 41 are used to enhance the durability of the moving apparatus 41 in the exposure apparatus and reduce the amount of abraded powder generated by the moving apparatus 41.

The configuration in FIG. 5 is shown as one example of the exposure apparatus. However, another configuration may also be employed. Further, in the third exemplary embodiment, the present invention is applied to the moving apparatus 41 which moves the optical component of the illumination optical system 33. However, the present invention may be applied to the moving apparatus 41 which moves other optical component.

Furthermore, the configuration in the first and the second exemplary embodiment can also be applied to an apparatus which moves an optical component other than the exposure apparatus.

Fourth Exemplary Embodiment

Figure 6:
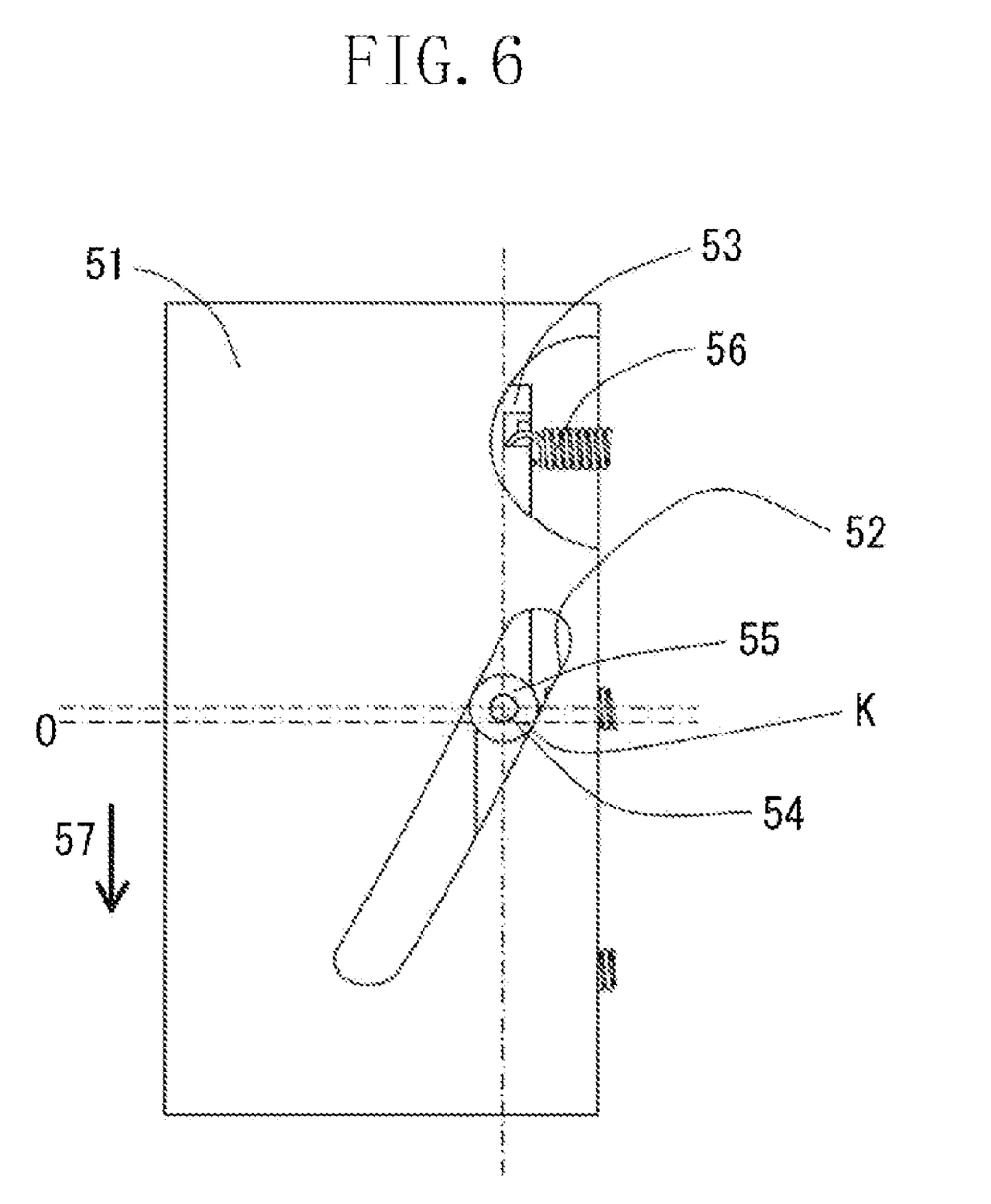
FIG. 6 is a side view illustrating a moving apparatus according to a fourth exemplary embodiment of the present invention.

FIG. 6 is a side view illustrating a moving apparatus according to a fourth exemplary embodiment of the present invention. In the first, second, and third exemplary embodiments, the moving direction of the moving member is given by a perpendicular direction which is a direction of gravity. However, in the fourth exemplary embodiment, the moving direction of the moving member is different from the direction of gravity.

A cam groove 52 is formed on a cylindrical cam barrel 51. A moving member 53 having the rotation center axis O is disposed inside the cam barrel 51. A support shaft 54 is mounted on the moving member 53 in a position corresponding to the cam groove 52 toward the cam groove 52. A bearing 55 is fixed on the support shaft 54. The moving member 53 is supported by the cam barrel 51 via the bearing 55. In such a configuration, while the cam barrel 51 and the moving member 53 are relatively rotated, the moving member 53 is moved in a horizontal direction. According to the present exemplary embodiment, force is continuously applied to the moving member 53 by an extension spring 56 in a direction containing a component parallel to a moving direction. Regardless of the direction 57 of gravity, the bearing 55 is brought into contact with the cam barrel 51 at a contact point K of the cam groove 52. In the present exemplary embodiment, the force is applied to the moving member 53 by the extension spring 56. However, the force may also be applied to the moving member 53 by a method other than the extension spring such as magnetic force and electrostatic force.

In the fourth exemplary embodiment, the contact point K between the bearing 55 and the cam groove 52 is determined by the extension spring 56. Thus, unlike the first and second exemplary embodiment, according to the fourth exemplary embodiment, the extended line of the axis line of the support shaft 54 is shifted by a predetermined offset amount from the rotation center axis O of the moving member 53 in a perpendicular direction. Further, when viewed from the axis direction of the support shaft 54, the contact point K between the bearing 55 and the cam groove 52 is located closer to the rotation center axis O side than the axis line of the support shaft 54 in a perpendicular direction. In order to produce such relation of position, the support shaft 54 is disposed on the moving member 53 or the cam groove 52 is formed on the cam barrel 51.

As a result, a difference between the moving direction of the cam barrel 51 in a contact position and the rotational moving direction of the bearing 55 can be reduced. Reducing of a difference in moving direction causes reduction in abrasion of the bearing 55 and the cam barrel 51. As a result, the durability of the moving member 53 can be enhanced and an abraded powder generated by abrasion can be reduced.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Applications No. 2007-066879 filed Mar. 15, 2007 and No. 2008-025236 filed Feb. 5, 2008, which are hereby incorporated by reference herein in their entirety.

What is claimed is:

1. A moving apparatus comprising:
    a cylindrical cam barrel including a cam groove;
    a moving member configured to be rotated relative to the cam barrel and moved in a perpendicular direction that is an axis direction of the cam barrel; and
    a bearing for supporting a support shaft fixed on the moving member with the cam groove, wherein when viewed from the axis direction of the support shaft, a contact position between the bearing and the cam groove is located closer to the side of the rotation center axis of the moving member than the axis line of the support shaft under force exerted in the axis direction of the cam barrel against the moving member,
    wherein a straight line connecting the contact position and the rotation center axis is substantially parallel on average to the axis line of the support shaft in a horizontal plane passing through the contact position, within a range of movement when the bearing and the support shaft are moved along the cam groove.

2. A moving apparatus comprising:

a cylindrical cam barrel including a cam groove;

a moving member configured to be rotated relative to the cam barrel and moved in a perpendicular direction that is an axis direction of the cam barrel; and a bearing for supporting a support shaft fixed on the moving member with the cam groove, wherein when viewed from the axis direction of the support shaft, a contact position between the bearing and the cam groove is located closer to the side of the rotation center axis of the moving member than the axis line of the support shaft under force exerted in the axis direction of the cam barrel against the moving member, wherein a straight line connecting the contact position and the rotation center axis is substantially parallel to the axis line of the support shaft in a horizontal plane passing through the contact position in a position where a distance in a horizontal direction between the contact position and the axis line of the support shaft is maximum when the bearing and the support shaft are moved along the cam groove.

* * * * *